(12) United States Patent
Tateshita

(10) Patent No.: US 10,950,415 B2
(45) Date of Patent: Mar. 16, 2021

(54) PLASMA PROCESSING APPARATUS AND PLASMA PROCESSING METHOD

(71) Applicant: TOKYO ELECTRON LIMITED, Tokyo (JP)

(72) Inventor: Koichi Tateshita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/703,393

(22) Filed: Dec. 4, 2019

(65) Prior Publication Data
US 2020/0185199 A1 Jun. 11, 2020

(30) Foreign Application Priority Data

Dec. 6, 2018 (JP) .............................. JP2018-228867

(51) Int. Cl.
*H01J 37/32* (2006.01)
*H01L 21/67* (2006.01)

(52) U.S. Cl.
CPC .. *H01J 37/32449* (2013.01); *H01J 37/32568* (2013.01); *H01L 21/67069* (2013.01); *H01J 37/32082* (2013.01); *H01J 2237/006* (2013.01); *H01J 2237/334* (2013.01)

(58) Field of Classification Search
CPC ........... H01J 37/32449; H01J 37/32568; H01J 2237/334; H01J 2237/006; H01J 37/32082; H01L 21/68742; H01L 21/67069
See application file for complete search history.

(56) References Cited

FOREIGN PATENT DOCUMENTS

| JP | H5-95037 U | 12/1993 |
| JP | 2000-331996 A | 11/2000 |
| JP | 2003-257937 A | 9/2003 |
| KR | 10-2018-0072551 A | 6/2018 |
| KR | 10-2018-0088496 A | 8/2018 |

*Primary Examiner* — Yuechuan Yu
(74) *Attorney, Agent, or Firm* — Nath, Goldberg & Meyer; Jerald L. Meyer

(57) ABSTRACT

According to one embodiment of the present disclosure, there is provided a plasma processing apparatus for performing plasma processing on a substrate in a processing container, the plasma processing apparatus comprising: an upper electrode; a power feeding rod; a gas diffusion plate having a plurality of ejection holes and disposed below the upper electrode; a gas introduction member; an insulation introduction member; a plurality of gas supply paths; and a confluence provided directly below a connection between the upper electrode and the power feeding rod, and configured to cause the processing gas from the gas supply paths to merge, wherein the processing gas after merging in the confluence flows in a space that is formed above the gas diffusion plate and communicating with the ejection holes.

8 Claims, 4 Drawing Sheets

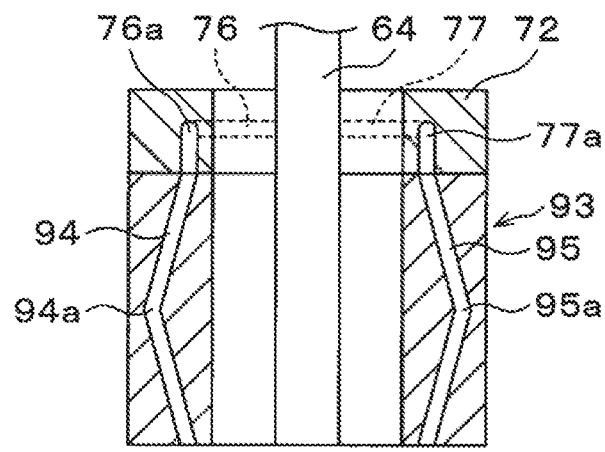
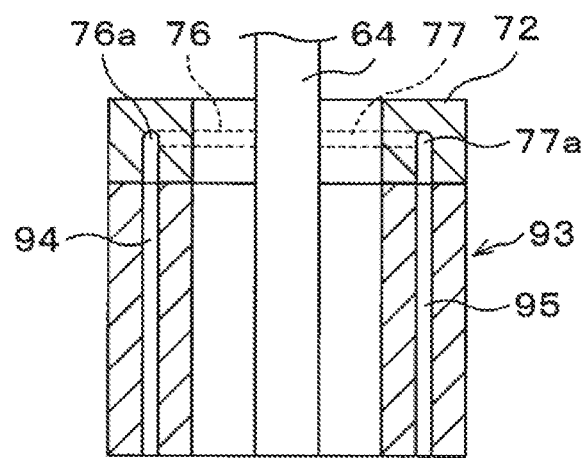

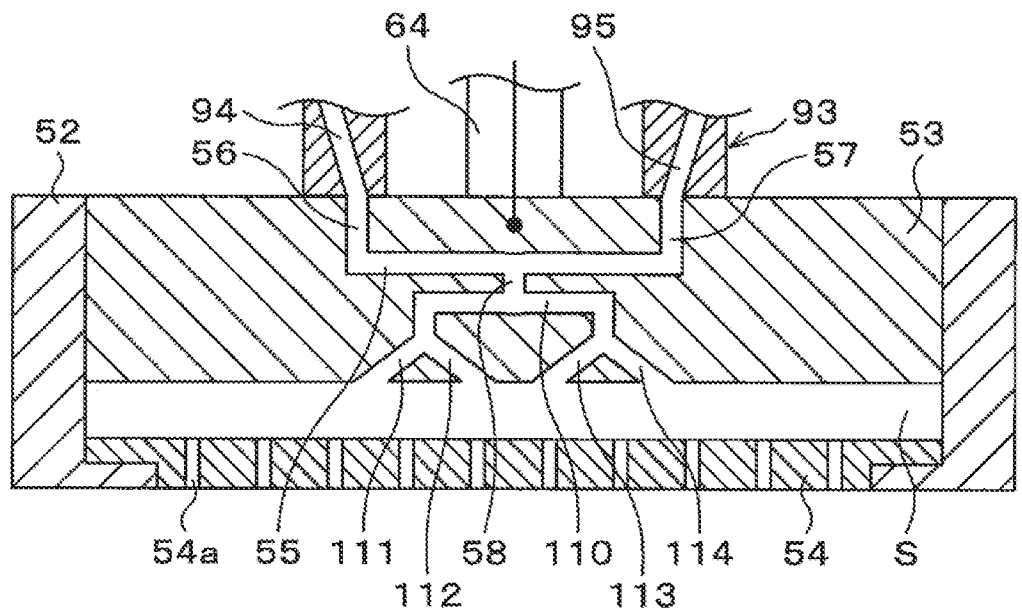
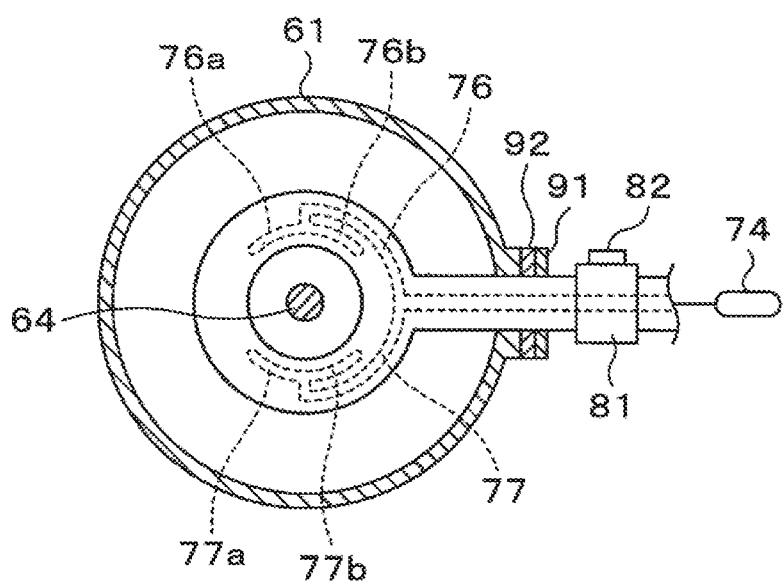

PLASMA PROCESSING APPARATUS AND PLASMA PROCESSING METHOD

CROSS-REFERENCE TO RELATED APPLICATION

This application is based upon and claims the benefit of priority from Japanese Patent Application No. 2018-228867, filed on Dec. 6, 2018, the entire contents of which are incorporated herein by reference.

TECHNICAL FIELD

The present disclosure relates to a plasma processing apparatus and a plasma processing method.

BACKGROUND

Patent Document 1 discloses a plasma processing apparatus, which includes a lower electrode also serving as a stage and an upper electrode facing the lower electrode and also serving as a gas shower head for supplying a processing gas to the lower electrode. In the apparatus, a voltage is applied across the lower electrode and the upper electrode so as to change the processing gas into plasma, so that a substrate on the stage is processed by the plasma. Patent Document 1 also describes that an electrode rod for supplying high-frequency power is connected to the central portion of the upper electrode, and a processing gas supply pipe is connected to the upper electrode at an eccentric position of the upper electrode.

PRIOR ART DOCUMENT

[Patent Document]
Patent Document 1: Japanese Laid-Open Patent Publication No. 2003-257937

SUMMARY

According to one embodiment of the present disclosure, there is provided a plasma processing apparatus for performing plasma processing on a substrate in a processing container, the plasma processing apparatus comprising: an upper electrode disposed in an upper side in the processing container; a power feeding rod configured to supply high-frequency power from a plasma source to a center of the upper electrode via a matcher; a gas diffusion plate having a plurality of ejection holes and disposed below the upper electrode; a gas introduction member configured to introduce a processing gas into the processing container, the gas introduction member including an annular portion that is disposed above the upper electrode and has a shape surrounding the power feeding rod, a gas flow path being formed in the annular portion; an insulation introduction member having a cylindrical shape and provided below the annular portion; a plurality of gas supply paths formed inside the insulation introduction member in a vertical direction to communicate with the gas flow path; and a confluence provided directly below a connection between the upper electrode and the power feeding rod, and configured to cause the processing gas from the gas supply paths to merge, wherein the processing gas after merging in the confluence flows in a space that is formed above the gas diffusion plate and communicating with the ejection holes.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a vertical cross-sectional view of an insulation introduction member in the plasma processing apparatus of FIG. 1.

FIG. 5 is a vertical cross-sectional view of another insulation introduction member that is capable of being used in the plasma processing apparatus of FIG. 1.

FIG. 6 is an explanatory vertical cross-sectional view of an upper electrode in a plasma processing apparatus according to another embodiment.

FIG. 7 is an explanatory plane view of another gas introduction member that is capable of being used in the plasma processing apparatus of FIG. 1.

DETAILED DESCRIPTION

Figure 1:
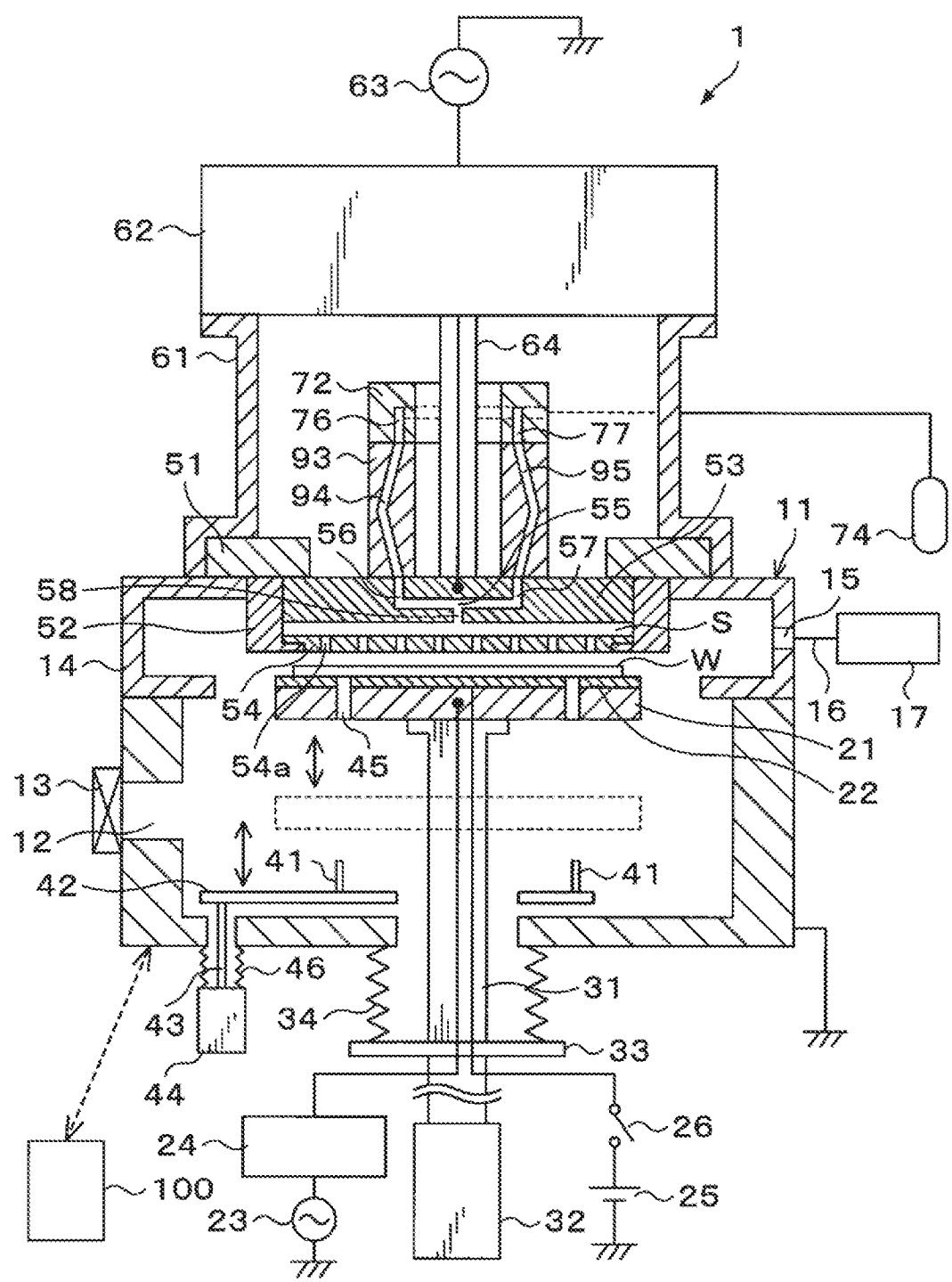
FIG. 1 is an explanatory vertical cross-sectional view schematically illustrating the configuration of a plasma processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor device manufacturing process, various kinds of plasma processing including etching processing and film-forming processing using a plasma processing apparatus are performed on a semiconductor wafer (which may be referred to as a "wafer"). In such case, for example, high-frequency power from a high-frequency power source is applied to the upper electrode in a processing container through a matcher so that plasma is generated in the processing container. In addition, a processing gas to be used for the plasma processing is supplied into the processing container from a gas diffusion plate called a shower plate disposed through a space under the upper electrode in the processing container.

In performing the plasma processing, a high-frequency power supply having a frequency of 60.0 MHz is used, but a power feeding rod is connected onto the central axis of the upper electrode in Patent Document 1 in order to improve plasma uniformity and process performance as well as to stably supply high-frequency power. Therefore, the processing gas is supplied to the upper surface side of the shower plate at a position eccentric from the central axis.

However, in consideration of recent fine processing, there has been a limit in uniformly supplying the processing gas into the processing container using the method of supplying the processing gas to the upper surface side of the shower plate at a position eccentric from the central axis. Thus, there has been a problem as to how to supply the processing gas uniformly from the central portion into the processing container while the high-frequency power is supplied to the central portion of the upper electrode.

Thus, in performing plasma processing using a plasma processing apparatus, the technique according to the present disclosure uniformly supplies the processing gas from the center into the processing container while high-frequency power is supplied to the central portion of the upper electrode, thereby further improving the uniformity of the plasma processing.

Hereinafter, the configuration of a plasma processing apparatus according to the present embodiment will be described with reference to the drawings. In this specification, elements having substantially the same functional configurations will be denoted by the same reference numerals and redundant descriptions will be omitted.

FIG. 1 schematically illustrates a configuration of a plasma processing apparatus 1 according to the present embodiment. The plasma processing apparatus 1 includes a processing container 11, which is a vacuum container configured to accommodate and process a wafer W as a substrate. The processing container 11 is made of a conductive metal, for example, A5052, which is an aluminum containing metal. The processing container 11 is grounded.

The plasma processing apparatus 1 is configured as an etching apparatus that is configured to remove, for example, a natural oxide film or a metal oxide film on the wafer W. That is, according to this plasma processing apparatus 1, it is possible to etch the wafer W using plasma generated from a well-known processing gas such as, for example, a halogen-containing gas and an inert gas.

The processing container 11 is configured in a substantially flat cylindrical shape, and a wafer loading and unloading port 12 is formed in the lower side wall in the processing container 11. A gate valve 13 capable of opening and closing the loading and unloading port 12 is provided in the loading and unloading port 12. In the upper side of the loading and unloading port 12, an exhaust duct 14 is provided to form a part of the side wall of the processing container 11 by bending a duct having a channel groove shape in a vertical section into an annular shape. In the inner circumferential surface of the exhaust duct 14, a slit-shaped exhaust port 15 extending in the circumferential direction is formed. One end of an exhaust pipe 16 is connected to the exhaust port 15. The other end of the exhaust pipe 16 is connected to the exhauster 17. For example, the exhauster 17 is constituted with a vacuum pump.

In the processing container 11, a stage 21 having a circular shape in a plan view is provided. The wafer W is horizontally placed on the stage 21. The stage 21 constitutes a lower electrode. An electrostatic chuck 22 is provided on the upper surface of the stage 21. A heater (not illustrated) is provided inside the stage 21 to heat the wafer W.

High-frequency power for bias, for example, high-frequency power of 13.56 MHz is supplied to the stage 21 from a high-frequency power supply 23 provided outside the processing container 11 via a matcher 24. A DC voltage is applied to the electrostatic chuck 22 from a DC power supply 25 provided outside the processing container 11. A switch 26 is configured to perform ON/OFF of the DC voltage.

An upper end of a support 31 extending in the vertical direction through a bottom portion of the processing container 11 is connected to a center portion of a lower surface side of the stage 21. A lower end of the support 31 is connected to a lifting mechanism 32. By driving the lifting mechanism 32, the stage 21 is movable up and down between a lower position indicated by a broken line in FIG. 1 and an upper position indicated by a solid line in FIG. 1. A lower position of the stage 21 is a delivery position for performing delivery of the wafer W, which enters into the processing container 11 from the above-mentioned loading and unloading port 12, between the stage 21 and a wafer W transport mechanism (not illustrated). In addition, an upper position becomes a processing position where the processing is performed on the wafer W.

On the support 31, a flange 33 is provided outside the processing container 11. In addition, a bellows 34 is provided between the flange 33 and a penetration portion, which the support 31 penetrates, of a bottom portion of the processing container 11 so as to surround an outer periphery of the support 31. As a result, airtightness of the processing container 11 is maintained.

Below the processing container 11, a wafer lifting member 42 having a plurality of (e.g., three) support pins 41 is disposed. A support column 43 is provided at a lower surface side of the wafer lifting member 42, and the support column 43 penetrates the bottom portion of the processing container 11 and is connected to a lifting mechanism 44 provided outside the processing container 11. Accordingly, the wafer lifting member 42 is movable up and down by driving the lifting mechanism 44.

When the stage 21 is in a delivery position, by raising the wafer lifting member 42, support pins 41 are capable of protruding from the stage 21 and the electrostatic chuck 22 via through holes 45 formed in the stage 21 and the electrostatic chuck 22. In this manner, the wafer W can be placed on the support pins 41, and in that state, delivery of the wafer W can be performed between the support pins 41 and a transport mechanism (not illustrated), such as a transport arm.

A bellows 46 is provided between the lifting mechanism 44 and the penetration portion, which the support 31 penetrates, of the bottom portion of the processing container 11 so as to surround the outer periphery of the support column 43. As a result, airtightness of the processing container 11 is maintained.

An annular insulation support 51 is provided above the exhaust duct 14. An electrode support 52 made of quartz is provided on the lower surface side of the insulation support 51. A disc-shaped upper electrode 53 is provided in the electrode support 52. Below the upper electrode 53, a shower plate 54 is provided in parallel with the upper electrode 53. A space S is formed between the upper electrode 53 and the shower plate 54. A plurality of ejection holes 54a are formed in the shower plate 54 and communicate with the space S.

A confluence 55 is provided at an inner center of the upper electrode 53. Specifically, inside the upper electrode 53, two flow paths 56 and 57, one ends of which are open on an upper surface side of the upper electrode 53, are formed to face each other with a central portion interposed between the two flow paths 56 and 57, and the other ends of the two flow paths 56 and 57 communicate with the above-mentioned confluence 55. Below the confluence 55, the flow path 58 communicating with the above-mentioned space S is formed.

A cylindrical shield member 61 is provided on the exhaust duct 14. The shield member 61 is made of a conductive metal, for example, A5052, which is an aluminum-containing metal, and is electrically connected with the processing container 11 via the exhaust duct 14. That is, the shield member 61 is grounded. The shield member 61 prevents leakage of high-frequency waves. When the shield member 61 and the upper side of the exhaust duct 14 are connected, the shield member 61 and the upper side of the exhaust duct 14 are connected in a spiral to enhance electrical conduction.

A matcher 62 is supported on the shield member 61. High-frequency power from a high-frequency power supply 63 serving as a plasma source for plasma generation is supplied to a power feeding rod 64 disposed on a lower surface side of the matcher 62 via the matcher 62. The power feeding rod 64 is connected to the center of the upper electrode 53. Thus, the high-frequency power from the high-frequency power supply 63 is supplied to the central portion of the upper electrode 53 via the matcher 62.

Figure 2:
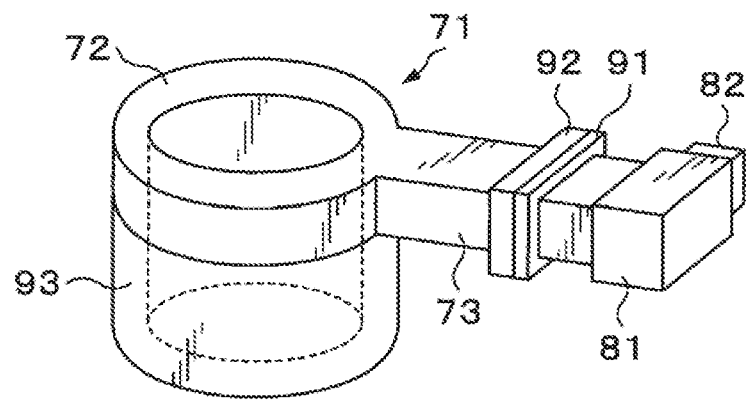
FIG. 2 is a perspective view of a gas introduction member in the plasma processing apparatus of FIG. 1.

Inside the shield member 61, an inlet block 71 as a gas introduction member is provided. As illustrated in FIG. 2, the inlet block 71 includes an annular portion 72 and a rectangular tube-shaped introduction portion 73 having one end connected to the annular portion 72. The inlet block 71 is made of a conductive metal, for example, A5052, which is an aluminum-containing metal.

Figure 3:
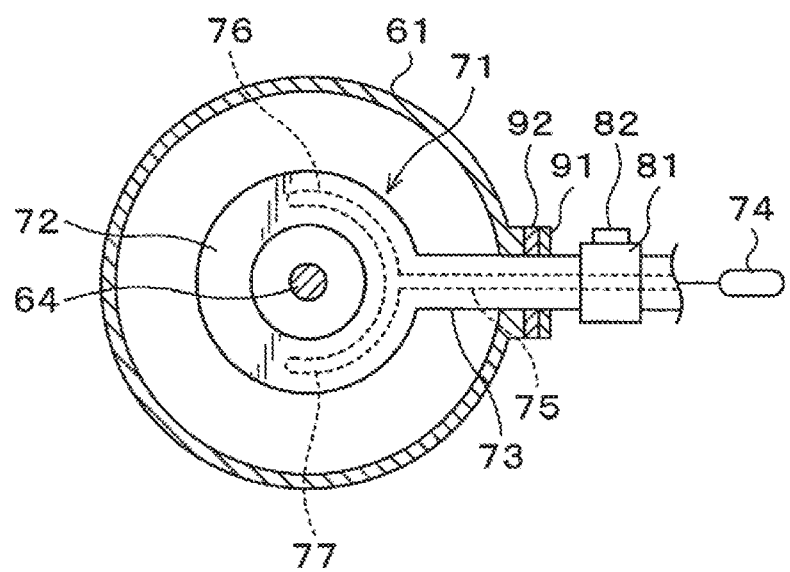
FIG. 3 is an explanatory plan view of the gas introduction member in the plasma processing apparatus of FIG. 1.

As illustrated in FIGS. 1 and 3, the annular portion 72 is disposed such that the power feeding rod 64 is located in a central portion of the annular portion 72, and has a size that forms a predetermined distance between an inner circumferential surface of the annular portion 72 and an outer circumferential surface of the power feeding rod 64.

The other end of the introduction portion 73 of the inlet block 71 is connected to the processing gas supply source 74 described above. As illustrated in FIG. 3, a gas flow path 75 is formed inside the introduction portion 73. Inside the annular portion 72, two diverging gas flow paths 76 and 77 are formed so as to communicate with the gas flow path 75. The gas flow paths 76 and 77 in the annular portion 72 are formed along the annular portion 72 and are formed to have a semicircular arc shape in a plan view.

A heating part 81 is provided outside the shield member 61 in the introduction portion 73 of the inlet block 71, and a heater 82 configured to heat the processing gas is provided in the heating part 81. Due to the heater 82, it is possible to heat the processing gas from the supply source 74 to a predetermined temperature of, for example, 100 degrees or higher.

As illustrated in FIG. 3, a flange portion 91 is provided outside the shield member 61 in the introduction portion 73 of the inlet block 71 and in the vicinity of the introduction portion 73 and a penetration portion of the shield member 61. A material of the flange portion 91 is A5052, which is the same aluminum-containing metal as the introduction portion 73 of the inlet block 71. A rectangular frame-shaped sealing member 92, which conforms to the outer shape of the introduction portion 73, is provided between the flange portion 91 and a wall surface of the penetration portion of the shield member 61. That is, the sealing member 92 is sandwiched between the wall of the shield member 61 and the flange portion 91 to seal the penetration portion.

A material of the sealing member 92 is conductive and has a lower thermal conductivity than the introduction portion 73, the flange portion 91, and the shield member 61. In the present embodiment, stainless steel SUS304 is used as the material of the sealing member 92.

As illustrated in FIGS. 1 and 2, below the annular portion 72 of the inlet block 71, a cylindrical insulation introduction member 93 having the same inner and outer diameter as the annular portion 72 is disposed between the annular portion 72 and the upper electrode 53. The insulation introduction member 93 is made of an insulating material.

Inside the insulation introduction member 93, gas supply paths 94 and 95 are formed to communicate with the gas flow paths 76 and 77 in the annular portion 72. More specifically, as illustrated in FIG. 4, at the ends of the gas flow paths 76 and 77 in the annular portion 72, gas flow paths 76a and 77a extending downwards are formed, and are connected to the upper ends of the gas supply paths 94 and 95.

The gas supply paths 94 and 95 formed inside the insulation introduction member 93 penetrate the insulation introduction member 93 in the vertical direction, and have bent portions 94a and 95a that are bent outwards in the middle portions of the gas supply paths 94 and 95. The bent portions 94a and 95a are formed at positions about halfway along the length of the gas supply paths 94 and 95. More specifically, the gas supply paths 94 and 95 are inclined outwards when moving downwards, and are inclined inwards from the bent portions 94a and 95a.

The gas supply paths 94 and 95 are formed such that the upper and lower ends of each of the gas supply paths 94 and 95 communicate with each other but are not visible each other in a straight line due to the presence of the bent portions 94a and 95a.

Each of lower ends of the gas supply paths 94 and 95 is connected to one end of one of the flow paths 56 and 57 of the upper electrode 53 described above. Accordingly, the processing gases from the supply source 74 passes through the gas flow path 75 in the introduction portion 73, the gas flow paths 76 and 77 in the annular portion 72, the gas supply paths 94 and 95 in the insulation introduction member 93, and the flow paths 56 and 57 in the upper electrode 53, and merge in the confluence 55 located directly below the connection between the upper electrode 53 and the power feeding rod 64.

Then, the processing gas merging in the confluence 55 is supplied to the space S between the upper electrode 53 and the shower plate 54 via the flow path 58. Then, the processing gas in the space S is uniformly supplied to the wafer W on the stage 21 from the ejection holes 54a in the shower plate 54.

In the plasma processing apparatus 1 having the above-described configuration, each operation is controlled by a controller 100. That is, the controller 100 is a computer, for example, and has a program memory (not illustrated). The program memory stores a program necessary for performing processing of a wafer W in the plasma processing apparatus 1 (e.g., supply, stop, and heating of the processing gas, raising/lowering operation of the stage 21, operation of the electrostatic chuck 22, raising/lowering operation of the wafer lifting member 42, oscillation stop of the high-frequency power supplies 23 and 63, and output control). The program may be recorded in a computer-readable storage medium, and may be installed in the controller 100 from the storage medium.

The plasma processing apparatus 1 according to the embodiment has the above-described configuration, and next, the operation and effects of the plasma processing apparatus 1 will be described.

The gate valve 13 is opened in a state in which the inside of the processing container 11 is in a predetermined vacuum atmosphere, and the wafer W is transported from a vacuum transport chamber (not illustrated) adjacent to the processing container 11 by a transport mechanism (not illustrate) onto the stage 21 located at the delivery position. Next, the wafer W is delivered onto the raised support pins 41, the transport mechanism is retracted from the processing container 11, and then the gate valve 13 is closed. At the same time, the support pins 41 are lowered, and the wafer W is placed on the stage 21. Then, the wafer W is attracted by the electrostatic chuck 22 of the stage 21, and the wafer W is heated to a predetermined temperature by the heater (not illustrated) of the stage 21.

Next, the high-frequency power supplies 23 and 63 are operated, and a heated processing gas is introduced from the inlet block 71 and supplied onto the wafer W, whereby a natural film, a metal oxide film, or the like formed on the surface of the wafer W is removed by plasma processing (e.g., etching processing).

In such plasma processing, in the plasma processing apparatus 1 according to the embodiment, the confluence 55 for merging processing gases from the gas supply paths 94 and 95 is provided directly below the connection between the upper electrode 53 and the power feeding rod 64. Accordingly, the processing gas is capable of being uniformly supplied onto the wafer W from the center of the upper electrode 53 through the space S and the shower head 54 while the high-frequency power is supplied to the central portion of the upper electrode 53. Accordingly, the plasma uniformity by power feeding from the central portion of the upper electrode 53, the improvement of process performance, and the stable supply of high-frequency power are ensured, and the uniform supply of the processing gas from the center of the upper electrode 53 is realized. Accordingly, it is possible to improve the uniformity of the plasma processing compared to the prior art.

In the plasma processing apparatus 1 according to the embodiment, the gas supply paths 94 and 95 formed inside the insulation introduction member 93 are formed such that the upper and lower ends of each the gas supply paths 94 and 95 are not visible each other in a straight line due to the presence of the bent portions 94a and 95a. Accordingly, it is possible to suppress, for example, the occurrence of abnormal discharge between the upper electrode 53 and the annular portion 72, and to suppress defective film formation caused by the abnormal discharge.

Further, since the bent portions 94a and 95a are bent outwards, that is, in a direction away from the power feeding rod 64, it is possible to ensure sufficient insulation performance at the positions of the bent portions 94a and 95a in the insulation introduction member 93 made of an insulating material. Accordingly, in combination with the distance between the outer periphery of the power feeding rod 64 and the inner periphery of the insulation introduction member 93, it is possible to suppress the influence of high-frequency waves emitted from the power feeding rod 64.

In addition, since the insulation introduction member 93 is drilled in an oblique direction from the upper and lower surfaces of the insulation introduction member 93, it is easy to form the bent portions 94a and 95a.

In the embodiment described above, the bent portions 94a and 95a are formed at a position that is about halfway along the length of the gas supply paths 94 and 95. However, without being limited thereto, the bent portions 94a and 95a may be set to a position close to the annular portion 72 or a position close to the upper electrode 53. In the embodiment described above, the upper and lower ends of the gas supply paths 94 and 95 are not visible each other in a linear form due to the bent portions 94a and 95a, but are not limited to this example.

As a result, the gas supply paths 94 and 95 need only penetrate the insulation introduction member 93 in the vertical direction, and a spiral flow path may be provided in each of the middle portions of the gas supply paths 94 and 95. It is sufficient for the gas supply paths 94 and 95 to have a shape in which the upper and lower ends of each of the gas supply paths 94 and 95 are not visible each other in a straight line.

Furthermore, although it depends on the configuration of the plasma processing apparatus 1, linear gas supply paths 94 and 95 may be formed in the insulation introduction member 93 as illustrated in FIG. 5, as long as it is possible to secure sufficient vertical length of the gas supply paths 94 and 95. From the viewpoint of realizing uniform supply of the processing gas from the center by the confluence 55 provided directly below the connection between the upper electrode 53 and the power feeding rod 64, the gas supply paths 94 and 95 having any of the shapes in FIGS. 4 and 5 may be adopted.

In the embodiment described above, since the sealing member 92 having a lower thermal conductivity than these members is provided on the introduction portion 73 and the peripheral edge of the penetration portion of the shield member 61, heat transfer to the matcher 62 is suppressed.

In the plasma processing apparatus 1 according to the embodiment described above, the processing gas is caused to flow into the space S through the flow path 58 from the confluence 55 provided directly below the connection between the upper electrode 53 and the power feeding rod 64, but the technology according to the present disclosure is not limited thereto.

For example, as illustrated in FIG. 6, a dispersion space 110 is provided below the flow path 58, and a plurality of dispersion flow paths 111, 112, 113, and 114 may be provided to communicate with the dispersion space 110 and to open into the space S. The dispersion space 110 may be one single space, or may be individual flow paths that are dispersed radially. In addition, any number of dispersion flow paths 111, 112, 113, and 114 may be provided as long as the dispersion flow paths 111, 112, 133, and 114 are configured to radially and uniformly disperse the processing gas from the center so as to cause the processing gas to flow into the space S. In the example of FIG. 6, for convenience of illustration, four dispersion flow paths 111, 112, 113, and 114 are illustrated, but there are actually eight flow paths.

As illustrated in FIG. 6, when the dispersion space 110 and the dispersion flow paths 111, 112, 113, and 114 are formed in the upper electrode 53, these may be formed in the single upper electrode 53. However, in consideration of easy workability when forming the dispersion space 110 and the dispersion flow paths 111, 112, 113, and 114, and the like, the upper electrode 53 may be configured by stacking appropriate conductive plates. In addition, the number of dispersion spaces and the number of dispersion flow paths are not limited thereto, and other dispersion spaces and dispersion flow paths may further be provided on the lower side.

In the plasma processing apparatus 1 according to the embodiment described above, the gas flow paths formed in the annular portion 72 are two diverging gas flow paths 76 and 77, but are not limited thereto.

For example, as illustrated in FIG. 7, each of the gas flow paths 76 and 77 may further diverge into two, and the gas flow paths 76a and 76b and the gas flow paths 77a and 77b may be formed in the annular portion 72. The four gas flow paths 76a, 76b, 77a, and 77b may be configured to be connected to four independent gas supply paths (not illustrated) penetrating the inside of the insulation introduction member 93 at equal intervals in the insulation introduction member 93. In this way, it is possible to uniformly supply a large amount of gas at a time by increasing the number of gas supply paths without changing the cross-sectional area of a gas supply path in the insulation introduction member 93. Of course, any of the gas supply paths may be provided with a bent portion constituted with the bent portions described above.

In this case, the flow paths in the upper electrode 53, which are connected to the four gas supply paths, are formed at four places. Then, processing gases from these four flow paths merge at the confluence 55.

In the case in which a determined volume of gas flows by increasing the number of gas supply paths formed in the insulation introduction member 93 compared to that in the embodiment described above without changing the cross-sectional area of the gas supply path as described above, it is possible to reduce the pressure in the flow path of the gas supply path. When the pressure in the flow path is lowered in such a manner, although it depends on the type of gas, generally, abnormal discharge hardly occurs up to a certain low-pressure area (Paschen's law), and thus the plasma is stabilized. As a result, in-plane uniformity is improved.

Although a plasma processing apparatus that performs an etching process is configured in the above-described embodiment, the technology according to the present disclosure may be implemented by configuring other plasma processing apparatuses, for example, a plasma film-forming apparatus.

It shall be understood that the embodiments disclosed herein are illustrative and are not limiting in all aspects. The above-described embodiments may be omitted, replaced, or modified in various forms without departing from the scope and spirit of the appended claims.

The following configurations also belong to the technical scope of the present disclosure.

(1) A plasma processing apparatus for performing plasma processing on a substrate in a processing container, the plasma processing apparatus including: an upper electrode disposed in an upper side in the processing container; a power feeding rod configured to supply high-frequency power from a plasma source to a center of the upper electrode via a matcher; a gas diffusion plate having a plurality of ejection holes and disposed below the upper electrode; a gas introduction member configured to introduce a processing gas into the processing container, the gas introduction member including an annular portion that is disposed above the upper electrode and has a shape surrounding the power feeding rod, a gas flow path being formed in the annular portion; an insulation introduction member having a cylindrical shape and provided below the annular portion; a plurality of gas supply paths formed inside the insulation introduction member in a vertical direction to communicate with the gas flow path; and a confluence provided directly below a connection between the upper electrode and the power feeding rod, and configured to cause the processing gas from the gas supply paths to merge, wherein the processing gas after merging in the confluence flows in a space that is formed above the gas diffusion plate and communicating with the ejection holes.

With the plasma processing apparatus having this configuration, it is possible to realize uniform supply of the processing gas from the center to the inside of the processing container while supplying high-frequency power to the central portion of the upper electrode in performing the plasma processing. Thus, the processing uniformity is improved compared with the prior art.

(2) In the plasma processing apparatus described in item (1), a plurality of diverging gas flow paths diverging from the gas flow path in an arc shape along the annular portion are connected to the gas supply paths in the insulation introduction member, respectively (3) In the plasma processing apparatus of item (1) or (2), the gas supply paths are formed inside the insulation introduction member such that upper and lower ends of each of the gas supply paths are not visible each other in a straight line.

With the plasma processing apparatus having this configuration, it is possible to suppress the occurrence of abnormal discharge in the gas supply paths.

(4) In the plasma processing apparatus of item (3), each of the gas supply paths includes a bent portion that is bent outwards in midstream in the insulation introduction member.

With the plasma processing apparatus having this configuration, it is easy to configure the gas supply paths each having a bent portion since the insulation introduction member is drilled, for example, in an oblique direction from upper and lower portions of the insulation introduction member.

(5) In the plasma processing apparatus described in any one of items (1) to (4), a plurality of dispersion flow paths are provided between the confluence and the space, and configured to disperse the processing gas from the confluence to flow into the space.

With the plasma processing apparatus having this configuration, it is also possible to uniformly supply the processing gas to the substrate.

(6) A plasma processing method using the plasma processing apparatus of any one of items (1) to (5) includes performing plasma processing on a substrate in the processing container.

According to the technique of the present disclosure, when high-frequency power is supplied to the central portion of the upper electrode, it is also possible to uniformly supply the processing gas from the center.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus for performing plasma processing on a substrate in a processing container, the plasma processing apparatus comprising:
   an upper electrode disposed in an upper side in the processing container;
   a power feeding rod configured to supply high-frequency power from a plasma source to a center of the upper electrode via a matcher;
   a gas diffusion plate having a plurality of ejection holes and disposed below the upper electrode;
   a gas introduction member configured to introduce a processing gas into the processing container, the gas introduction member including an annular portion that is disposed above the upper electrode and has a shape surrounding the power feeding rod, a gas flow path being formed in the annular portion;
   an insulation introduction member having a cylindrical shape and provided below the annular portion;
   a plurality of gas supply paths formed inside the insulation introduction member in a vertical direction to communicate with the gas flow path; and
   a confluence provided directly below a connection between the upper electrode and the power feeding rod, and configured to cause the processing gas from the gas supply paths to merge, wherein the processing gas after merging in the confluence flows in a space that is formed above the gas diffusion plate and communicating with the ejection holes.

2. The plasma processing apparatus of claim 1, wherein a plurality of diverging gas flow paths diverging from the gas flow path in an arc shape along the annular portion are connected to the gas supply paths in the insulation introduction member, respectively.

3. The plasma processing apparatus of claim 2, wherein the gas supply paths are formed inside the insulation introduction member such that upper and lower ends of each of the gas supply paths are not visible each other in a straight line.

4. The plasma processing apparatus of claim 3, wherein each of the gas supply paths includes a bent portion that is bent outwards in midstream in the insulation introduction member.

5. The plasma processing apparatus of claim 4, further comprising a plurality of dispersion flow paths formed between the confluence and the space, and configured to disperse the processing gas from the confluence to flow into the space.

6. The plasma processing apparatus of claim 1, wherein the gas supply paths are formed inside the insulation introduction member such that upper and lower ends of each of the gas supply paths are not visible each other in a straight line.

7. The plasma processing apparatus of claim 6, wherein each of the gas supply paths includes a bent portion that is bent outwards in midstream in the insulation introduction member.

8. The plasma processing apparatus of claim 1, further comprising a plurality of dispersion flow paths formed between the confluence and the space, and configured to disperse the processing gas from the confluence to flow into the space.

* * * * *